(12) United States Patent
Hawawini et al.

(10) Patent No.: US 9,052,886 B2
(45) Date of Patent: *Jun. 9, 2015

(54) HIGH VOLTAGE DEDICATED CHARGING PORT

(71) Applicant: QUALCOMM Incorporated, San Diego, CA (US)

(72) Inventors: Shadi Hawawini, Mountain View, CA (US); Georgios Konstantinos Paparrizos, Foster City, CA (US)

(73) Assignee: QUALCOMM, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/252,632

(22) Filed: Apr. 14, 2014

(65) Prior Publication Data

US 2014/0325246 A1    Oct. 30, 2014

Related U.S. Application Data

(63) Continuation of application No. 13/759,865, filed on Feb. 5, 2013, now Pat. No. 8,745,301.

(60) Provisional application No. 61/719,822, filed on Oct. 29, 2012.

(51) Int. Cl.
| | |
|---|---|
| G06F 1/00 | (2006.01) |
| G06F 1/26 | (2006.01) |
| H02J 7/00 | (2006.01) |
| G06F 1/32 | (2006.01) |
| G01R 19/25 | (2006.01) |

(52) U.S. Cl.
CPC ............... *G06F 1/266* (2013.01); *H02J 7/0052* (2013.01); *G01R 19/2509* (2013.01); *G06F 1/26* (2013.01); *G06F 1/3203* (2013.01); *H02J 7/0068* (2013.01); *H02J 7/0055* (2013.01); *H02J 2007/0001* (2013.01); *H02J 2007/0062* (2013.01); *H02J 7/0004* (2013.01)

(58) Field of Classification Search
CPC ......... G06F 1/3203; G06F 1/26; G06F 1/266; G01R 19/2509; H02J 7/0068
USPC .................................. 713/310, 316; 320/137
See application file for complete search history.

(56) References Cited

U.S. PATENT DOCUMENTS

| | | |
|---|---|---|
| 6,813,674 B1 | 11/2004 | Velasco et al. |
| 6,839,570 B2 | 1/2005 | Hutchison et al. |

(Continued)

FOREIGN PATENT DOCUMENTS

| | | |
|---|---|---|
| EP | 1487081 A2 | 12/2004 |
| EP | 2296248 A2 | 3/2011 |

OTHER PUBLICATIONS

"Battery Charging Specification," Revision 1.2, Dec. 7, 2010, pp. 71.

(Continued)

*Primary Examiner* — M'Baye Diao
(74) *Attorney, Agent, or Firm* — Fountainhead Law Group P.C.

(57) ABSTRACT

Circuitry in an adapter, such as a power supply, can provide power at a desired voltage level to a portable device. The circuitry may assert one of several electrical configurations on the cabling that electrically connects the portable device to the external device to indicate to the external device a desired voltage level.

22 Claims, 8 Drawing Sheets

(56) References Cited

U.S. PATENT DOCUMENTS

| | | | |
|---|---|---|---|
| 7,039,821 | B1 | 5/2006 | Potega |
| 7,127,623 | B2 | 10/2006 | Potega et al. |
| 7,302,282 | B2 | 11/2007 | McKim, Jr. et al. |
| 7,360,004 | B2 | 4/2008 | Dougherty et al. |
| 7,447,922 | B1 | 11/2008 | Asbury et al. |
| 7,978,600 | B2 | 7/2011 | Itabashi et al. |
| 8,237,414 | B1 | 8/2012 | Li et al. |
| 2002/0000793 | A1 | 1/2002 | Hanaki |
| 2005/0139363 | A1 | 6/2005 | Thomas |
| 2005/0174094 | A1 | 8/2005 | Purdy et al. |
| 2008/0059816 | A1 | 3/2008 | Paniagua et al. |
| 2011/0276734 | A1 | 11/2011 | Helfrich |
| 2012/0023344 | A1 | 1/2012 | Miyanaga |
| 2012/0119696 | A1 | 5/2012 | Picard |
| 2012/0210146 | A1 | 8/2012 | Lai et al. |
| 2012/0217935 | A1 | 8/2012 | Hawawini et al. |
| 2012/0271979 | A1 | 10/2012 | Considine et al. |

OTHER PUBLICATIONS

Compaq, et al., "Universal Serial Bus Specification Revision 2.0," Apr. 27, 2000, http://www.usb.org/developers/docs/, 650 pages.

Shimpi A.L., et al., "The iPhone 5 Review," AnandTech, Oct. 16, 2012, 6 Pages.

"Universal Serial Bus Power Delivery Specification," Revision 1.0, Jul. 5, 2012, pp. 1-303.

International Search Report and Written Opinion—PCT/US2013/066847—ISA/EPO—Oct. 6, 2014.

Table 5-1 Voltages

| Parameter | Symbol | Conditions | Min | Max | Units | Ref |
|---|---|---|---|---|---|---|
| ACA operating voltage | VACA_OPR | | 4.1 | 6.0 | V | 6.2.6 |
| VBUS Leakage Voltage | VBUS_LKG | | | 0.7 | V | 4.1.3 |
| Charging Port Output Voltage | VCHG | | 4.75 | 5.25 | V | 4 |
| Charging Port Failure Voltage | VCHG_FAIL | | -0.3 | 9.0 | V | 4.1.5 |
| Charging Port Overshoot Voltage | VCHG_OVRSHT | | | 6.0 | V | 4.1.1 |
| Charging Port Undershoot Voltage | VCHG_UNDSHT | | 4.1 | | V | 4.2.2 |
| Data Line Leakage Voltage | VDAT_LKG | | 0 | 3.6 | V | 3.2.3 |
| Data Detect Voltage | VDAT_REF | | 0.25 | 0.4 | V | 3.2 |
| Data Sink Voltage | VDAT_SINK | | | 0.15 | V | 3.4.2 |
| DCP Shut Down Voltage | VDCP_SHTDWN | | | 2.0 | V | 4.4.1 |
| D- Source Voltage | VDM_SRC | Note 1 | 0.5 | 0.7 | V | 3.2 |
| D+ Source Voltage | VDP_SRC | Note 2 | 0.5 | 0.7 | V | 3.2 |
| D+ pull-up Voltage | VDP_UP | | 3.0 | 3.6 | V | 3.2.4.4 |
| Ground offset voltage between Host and PD | VGND_OFFSET | | | 375 | mV | 3.5 |
| Logic Threshold | VLGC | | 0.8 | 2.0 | V | 3.2.3 |
| Logic High | VLGC_HI | | 2.0 | 3.6 | V | 3.2.3 |
| Logic Low | VLGC_LOW | | 0 | 0.8 | V | 3.2.3 |
| OTG Session Valid Voltage | VOTG_SESS_VLD | | 0.8 | 4.0 | V | 3.1 |

Fig. 7

HIGH VOLTAGE DEDICATED CHARGING PORT

CROSS REFERENCE TO RELATED APPLICATIONS

This application is a continuation application and pursuant to 35 U.S.C. §120 is entitled to and claims the benefit of earlier filed application U.S. application Ser. No. 13/759,865 filed Feb. 5, 2013, the content of which is incorporated herein by reference in its entirety for all purposes.

Pursuant to 35 U.S.C. §119(e), U.S. application Ser. No. 13/759,865 is entitled to and claims the benefit of the filing date of U.S. Provisional App. No. 61/719,822 filed Oct. 29, 2012, the content of which is incorporated herein by reference in its entirety for all purposes.

BACKGROUND

Unless otherwise indicated herein, the approaches described in this section are not prior art to the claims in this application and are not admitted to be prior art by inclusion in this section.

Power requirements for modern portable electronics are increasing very rapidly; e.g., devices having larger displays, LTE devices (radios, modems, etc.), multi-core processors, and so on. To maintain acceptable up times, such devices utilize batteries with higher capacity. In such systems, battery charging times tend to be very long when conventional power sources are used. The reasons include: (1) limited power capability (USB 5V/1.8 A max); and (2) voltage headroom issues between input power source and battery. Furthermore, many readily available power sources (e.g., monitors, notebooks, etc.) cannot be utilized because of their high-voltage operation vs. what the portable device can tolerate. Implementing a solution that requires the use of a secondary portable device connector significantly increases solution and consumer cost (proprietary connector, wall adapter, etc.).

With battery capacities increasing, 5V input voltage does not provide enough voltage headroom to achieve sufficiently high charge currents due to cable, connector, PCB, and charger impedances. Many batteries now have a float voltage of 4.35V which makes this issue worse, especially since the trend is toward the use of higher voltages. For example, a 2 S stack provides about 8.4V or 8.7V, thus requiring a voltage higher than 5V to charge efficiently.

SUMMARY

A circuit for an adapter may include a detection circuit to detect an electrical configuration of the signal lines that comprise a cable for connecting the circuit to the portable device. The detection circuit may detect one of several electrical configurations on the signal lines. In response, the circuit may supply a voltage on a power line in the cable at a voltage level corresponding to the electrical configuration asserted on the signal lines.

In some embodiments, the circuit operates in accordance with the USB Battery Charging Specification. The power line may be VBUS and the signal lines may be the D+ and D− lines as set forth in the USB Specification. The circuit can be backward compatible with industry standards, allowing for existing standardized connectors and cabling, while at the same time allowing for a greater range of operational voltages beyond the standard 5V operating level of the USB specification.

The following detailed description and accompanying drawings provide a better understanding of the nature and advantages of the present disclosure.

BRIEF DESCRIPTION OF THE DRAWINGS

FIG. 7 shows voltage levels according to the USB Battery Charging Specification.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
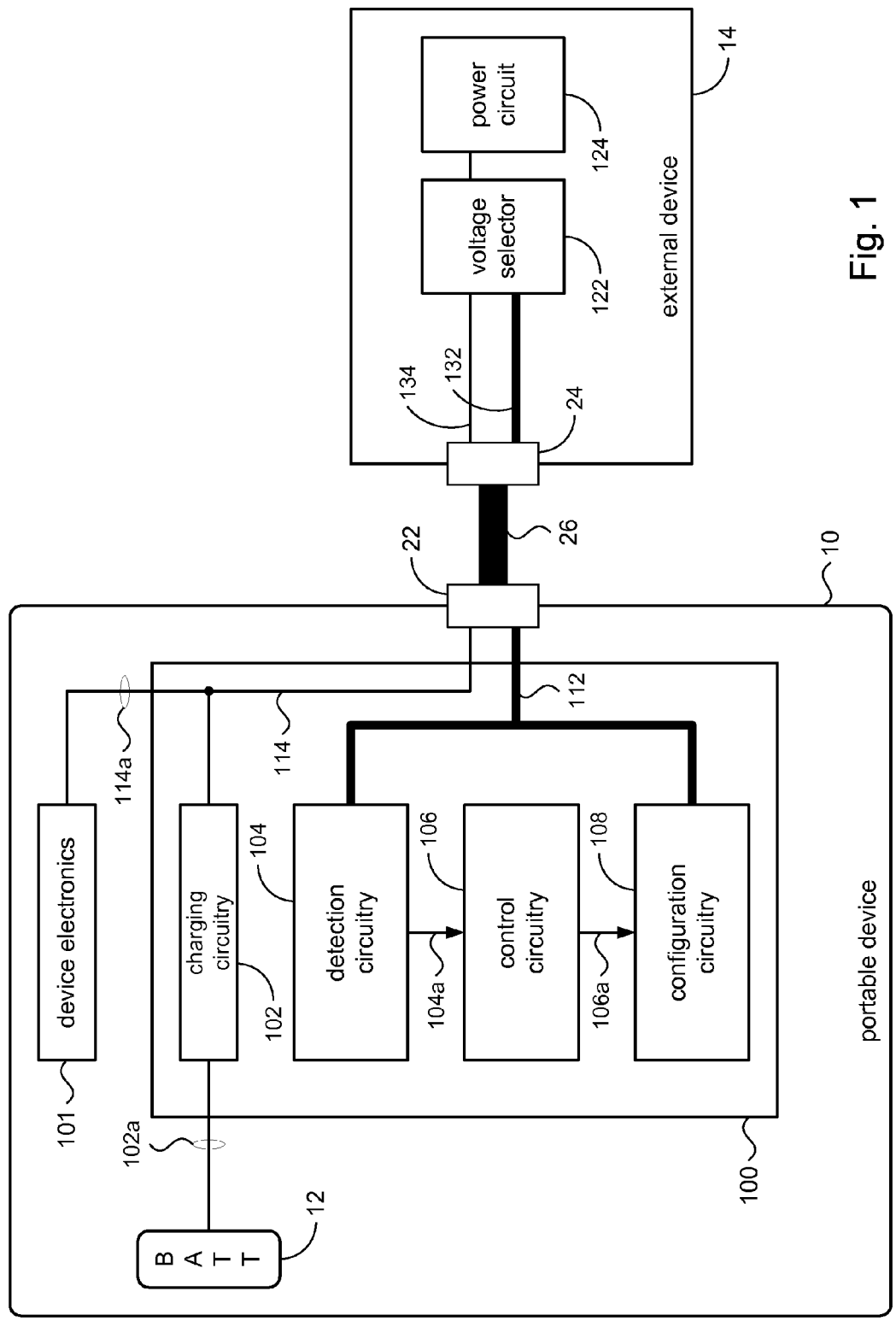
FIG. 1 is a high level generic block diagram of circuitry according to the present disclosure.

FIG. 1 shows a circuit 100 in accordance with embodiments of the present disclosure. The circuit 100 may be included in a portable device 10 such as a smartphone, computer tablet, and so on. The portable device 10 may include a battery 12 to power the portable device. In some embodiments, the battery 12 may be a rechargeable battery that the circuit 100 may charge. The battery 12 may be a single cell configuration, or may be a multi-cell stack.

The portable device 10 may be connected to an external device 14. In some embodiments, the external device 14 may be an alternating current (AC) adapter such as a wall adapter. In other embodiments, the external device 14 may be an electronic device that can supply power to the portable device. For example, the external device 14 may be laptop computer that supplies power from its own battery pack or by virtue of being connected to an AC supply.

The portable device 10 and external device 14 may have respective connectors 22 and 24. A cable 26 may electrically connect the portable device 10 and the external device 14.

In some embodiments, the circuit 100 may include charging circuitry 102, detection circuitry 104, control circuitry 106, and configuration circuitry 108. The circuit 100 may include a power bus 114 for electrical connection to a power line in the cable 26. The circuit 100 may further include a signal bus 112 comprising a plurality of signal bus lines for electrical connection to signal lines in the cable 26. The number of signal bus lines comprising the signal bus 112 may vary from one embodiment to another. For example, a design based on the USB Specification defines two signal bus lines, D+ and D−, while another design may employ more than two signal bus lines.

The charging circuitry 102 may be connected to the power bus 114 to transfer power from a voltage supplied by the external device 14 to charge the battery 12. The charging circuitry 102 may be of any known design, such as a switching charger design for instance.

The detection circuitry 104 may be connected to the signal bus 112 to detect various electrical configurations on the signal bus lines comprising the signal bus. The external device 14 may assert an electrical configuration on the signal lines of the cable 26 that the detection circuitry 104 may detect on the signal bus 112. In some embodiments, the detection circuitry 104 may comprise voltage comparators, current sensors, and the like to detect an electrical configuration on the signal bus 112.

An electrical configuration asserted on the signal bus lines of the signal bus 112 may be a voltage level (including ground potential) asserted one or more signal bus lines, or multiple voltage levels asserted on several signal bus lines. An electrical configuration may also be one or more currents flowing respectively in one or more of the signal bus lines. In some embodiments, an electrical configuration may be asserted by connecting one or more of the signal bus lines to a resistor (or other passive device such as a capacitor or inductor), or connecting together one or more of the signal bus lines. In some embodiments, an electrical configuration may be asserted using a combination of voltage, current flows, and/or resistor (or other passive device).

As mentioned above, an electrical configuration may be asserted on the signal bus lines of the signal bus 112 by an external device 14 electrically connected to the signal bus via cable 26. Similarly, an electrical configuration may be asserted on the signal bus lines by the configuration circuitry 108. In some embodiments, for example, the configuration circuitry 108 may include voltage sources, current sources, switches (e.g., MOS switches), passive devices (e.g., a resistor), and the like to assert some combination of voltage levels and/or current levels on one or more of the signal bus lines that comprise the signal bus 112.

The control circuitry 106 may be connected to receive one or more signals 104a from the detection circuitry 104. The signals 104a may be indicative of a detected electrical configuration asserted on the signal bus 112 by the external device 14. The control circuitry 106 may be connected to provide one or more control signals 106a to the configuration circuitry 108 in order to assert a particular electrical configuration on the signal bus 112.

The portable device 10 may further comprise device electronics (load) 101. For example, if the portable device 10 is a computer tablet, the device electronics 101 may comprise the components such as a processor, memory, display, etc. The device electronics 101 may be connected to the power bus 114 via connector 114a to draw power received by the circuit 100.

The external device 14 may include a voltage selector 122 and a power section 124, in addition to other electronic circuitry (not shown) comprising the external device. For example, the external device 14 may be laptop computer, or the external device may be a power supply (e.g., an AC adapter), etc. The power circuit 124 may provide a voltage at one of several selectable voltage levels that can be delivered to the portable device 10 via cable 26. For example, the external device 14 may include a power bus 134 that is connected to the power line in the cable 26. The voltage selector 122 may connect the voltage produced by the power section 124 to the power bus 134. In some embodiments, the voltage selector 122 may be connected to a signal bus 132 comprising a plurality of signal bus lines, which may be electrically connected to signal bus 112 via cable 26. As will be explained in more detail below, the voltage selector 122 may detect or sense an electrical configuration on the signal bus 132 and control or otherwise signal the power section 124 to output a voltage level that corresponds to the detected electrical configuration. The voltage selector 122 may comprise digital logic, analog circuitry, or a combination of digital and analog components to detect or sense the electrical configuration on the signal bus 132.

Figure 2:
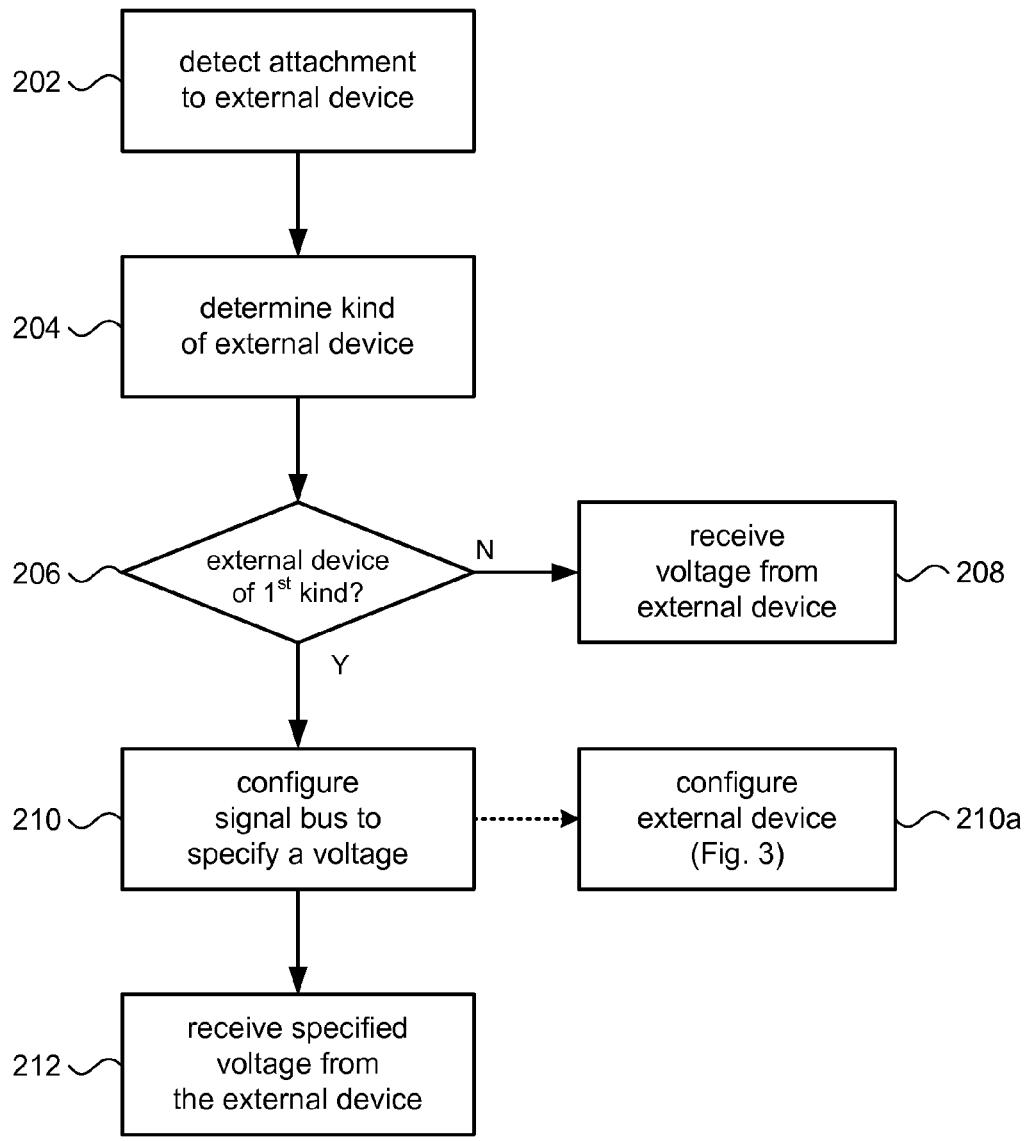
FIG. 2 is a high level functional flow chart of processing in accordance with the present disclosure.

FIG. 2 illustrates an operation of the circuit 100 in conjunction with an external device according to principles of the present disclosure. At block 202, the circuit 100 may detect an attachment to an external device (e.g., 14, FIG. 1). For example, the circuit 100 may include circuitry (not shown) to detect the presence of a voltage on the power bus 114 that is provided by the external device 14.

At block 204, the circuit 100 may determine what kind of external device is attached to the circuit. For example, the external device 14 may be a conventional power supply that supplies a single output voltage. In accordance with the present disclosure, the circuit may be attached to an external device that is capable of supplying a voltage at any one of several selectable voltage levels.

In some embodiments, the external device 14 may assert an electrical configuration on the signal bus 132 to indicate what kind of device it is. Merely to illustrate, suppose the signal bus 132 comprises two signal bus lines. An electrical configuration on the two signal bus lines may be asserted by the external device 14 (e.g., using voltage selector 122) by connecting a resistor between two of the signal bus lines and applying a predetermined direct current (DC) voltage level on the other signal bus line. Another electrical configuration might involve applying two different DC voltage levels on each of the signal bus lines, and so on.

The detection circuitry 104 may sense the particular electrical configuration asserted by the external device by sensing the signal bus lines comprising the signal bus 112. Based on the electrical configuration sensed by the detection circuitry 104, signal(s) 104a may be provided to the control circuitry 106 to indicate the kind of external device that is attached to the circuit 100. In accordance with the present disclosure, if at block 206, the electrical configuration sensed at block 204 indicates that the external device 14 is of a first kind (e.g., has selectable voltage levels) then additional processing may be performed, as described below. If the external device 14 is not of the first kind, then the circuit 100 may operate under the assumption that it is attached to an external device that is capable of outputting a single voltage level, and at block 208 receive the voltage from the external device. Accordingly, at block 208, the voltage received by the circuit 100 may then be used to charge a battery (e.g., 26, FIG. 1) or provide power to a load (e.g., 101).

If, at block 206, the external device 14 is determined to be of the first kind where the external device supports multiple selectable output voltage levels, then in accordance with principles of the present disclosure, the circuit 100 at block 212 may use the configuration circuitry 108 to assert an electrical configuration on the signal bus 112 from among several predefined electrical configurations. In some embodiments, for example, the circuit 100 may support different kinds of battery 12, having different voltage levels for proper battery charging. For instance, some batteries may be charged with 5 volts, other batteries may require 9 volts, 12 volts, 20 volts, and so on. Likewise, different types of loads 101 may operate at different voltage levels. Accordingly, the control circuitry 106 may generate signals 106a to operate the configuration circuitry 108 to assert an electrical configuration on the signal bus 112 that corresponds to a specified voltage level.

Each predefined electrical configuration may be associated with a predefined voltage level. Merely to illustrate this point, consider the following example. Suppose the signal bus 112 comprises two signal bus lines. A first electrical configuration that may be asserted on the signal bus lines may include asserting 1.5V on one line and 3V on the other line. This configuration may be associated with a voltage level say, for example, 10V. A second electrical configuration might be to short the first and second signal bus lines, and this configuration may be associated with a voltage level of, say, 15V, and so on.

If the circuit 100 requires 10V, then the configuration circuitry 108 may assert the first electrical configuration on the signal bus 112. Likewise, if the circuit 100 requires 15V, then the configuration circuitry 108 may assert the second electrical configuration on the signal bus 112, and so on. In accordance with principles of the present disclosure, the circuit 100 may specify to the external device 14 what voltage level to output when the external device can support multiple outputs by asserting a suitable electrical configuration on the signal bus lines that the external device may detect. These voltage levels, of course, are merely to illustrate an example; specific voltage levels will depend on implementation, adherence to industry specs., and so on.

In some embodiments, the electrical configuration asserted on the signal bus 112 may be detected by the external device 14 at block 210a, and in response, the external device may reconfigure itself to output a voltage level that corresponds to the detected electrical configuration. At block 212, the circuit 100 may receive a voltage from the external device 14 at the specified voltage level. For example, the circuit 100 may use the received voltage to charge a battery (e.g., 26, FIG. 1) or to provide power to a load (e.g., 101, FIG. 1).

Figure 3:
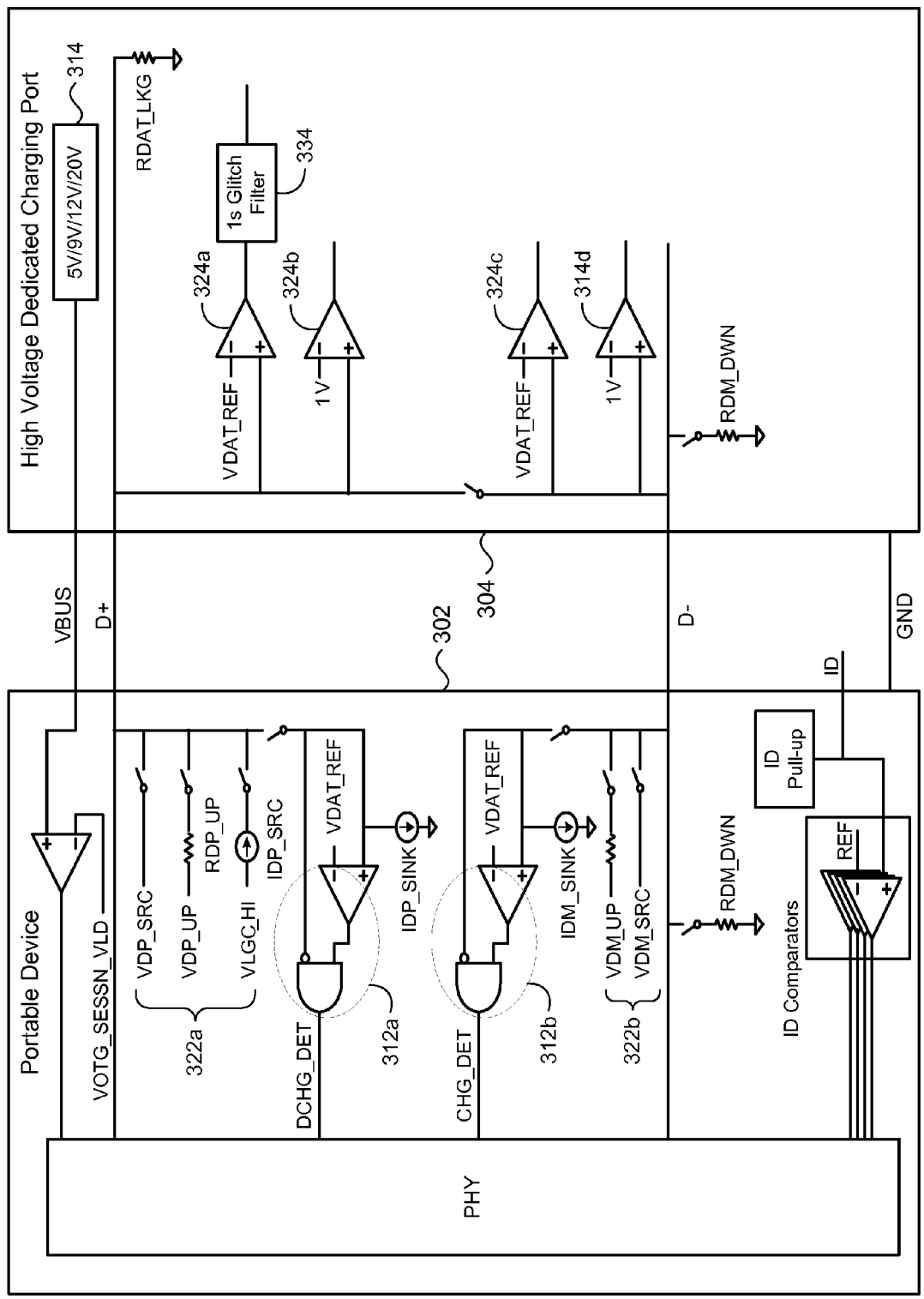
FIG. 3 shows an illustrative embodiment based on the USB Specification.

A specific embodiment according to principles of the present disclosure may be incorporated in the Universal Serial Bus (USB) interface (e.g., USB Specification, Revision 2.0) as depicted in FIG. 3. More particularly, the embodiment depicted in FIG. 3 may include an embodiment of circuit 100 that is based on the USB Battery Charging Specification, Revision 1.2 (BC1.2). A large majority of devices conform to BC1.2, and so this embodiment may have desirable benefits from in terms of manufacturing and installed user base. Accordingly, in some embodiments, circuit 100 may operate in conformance with BC1.2, thus providing for devices that are compatible with existing devices, are easy to manufacture (since most of the circuitry has already been designed), and offer benefits of the present disclosure.

A portable device 302 may attach to an external device 304. The portable device 302 may be any electronic device that incorporates a USB interface; e.g., mobile communication device, digital camera, computer tablet, etc. Likewise, the external device 304 may be any electronic device that incorporates a USB interface and can provide power to the portable device 302, including power supplies, battery chargers, other electronic devices such as a computer, and so on.

A cable (e.g., cable 26, FIG. 1) that mechanically and electrically connects the portable device 302 and the external device 304 may comprise four wires including a power line called VBUS, signal bus lines D+ and D−, and a ground line. These four wires are found in standard USB A and USB B plugs (e.g., connectors 22 and 24, FIG. 1). Accordingly, VBUS constitutes an example of power bus 114 and 134 shown in FIG. 1. The D+ and D− lines represent an example of signal lines comprising signal bus 112 and 132 shown in FIG. 1.

In some embodiments, the portable device 302 may include a comparator to compare a voltage asserted on VBUS with a voltage level $V_{OTG\_SESSN\_VLD}$. The comparator may be used to determine that an attachment to external device 304 has been made; e.g., when the voltage level on VBUS exceeds $V_{OTG\_SESSN\_VLD}$.

The portable device 302 may include detection circuitry 312a, 312b, which produce respective signals DCH_DET and CHG_DET. As explained above in connection with the detection circuitry 104 shown in FIG. 1, the detection circuitry 312a, 312b in FIG. 3 may detect different electrical configurations on the D+ and D− lines, as will be described in more detail below.

Configuration circuitry 322a may include voltage sources $V_{DP\_SRC}$, $V_{DP\_UP}$ & resistor $R_{DP\_UP}$, $V_{LGC\_HI}$ & current source $I_{DP\_SRC}$, and $I_{DP\_SINK}$, and their respective switches for selective connection to the D+ line. Additional configuration circuitry 322b may also include $V_{DM\_UP}$, $V_{DM\_SRC}$, $R_{DM\_DWN}$, and $I_{DM\_SINK}$, and their respective switches for selective connection to the D− line. As explained above in connection with the configuration circuitry 108 shown in FIG. 1, the configuration circuitry 322a, 322b in FIG. 3 may assert different electrical configurations on the D+ and D− lines, as will be described in more detail below.

In accordance with the present disclosure, the external device 304 may include a power supply 314 having an output voltage with selectable voltage levels. For example, the selectable voltage levels may be 5V, 9V, 12V, and 20V. Of course, fewer or more levels may be provided, different levels may be output, and so on. The external device 304 may further include comparators 324a, 324b, 324c, and 324d for detecting voltage levels and current flows (e.g., through resistors $R_{DAT\_LKG}$ and $R_{DM\_DWN}$) on the D+ and D− lines. The voltage levels and current flows define different electrical configurations that can be asserted on the D+ and D− lines by the portable device 302. The reference levels shown in FIG. 3 use 1 V voltage levels, but it will be appreciated that in other embodiments, the reference levels may be at other voltage levels.

As will be explained below, the external device 304 may also assert different electrical configurations on the D+ and D− lines using the resistors $R_{DAT\_LKG}$ and $R_{DM\_DWN}$. In some embodiments, a glitch filter 334 may be provided to avoid false positive detections due to noise on the D+ line.

Figure 4:
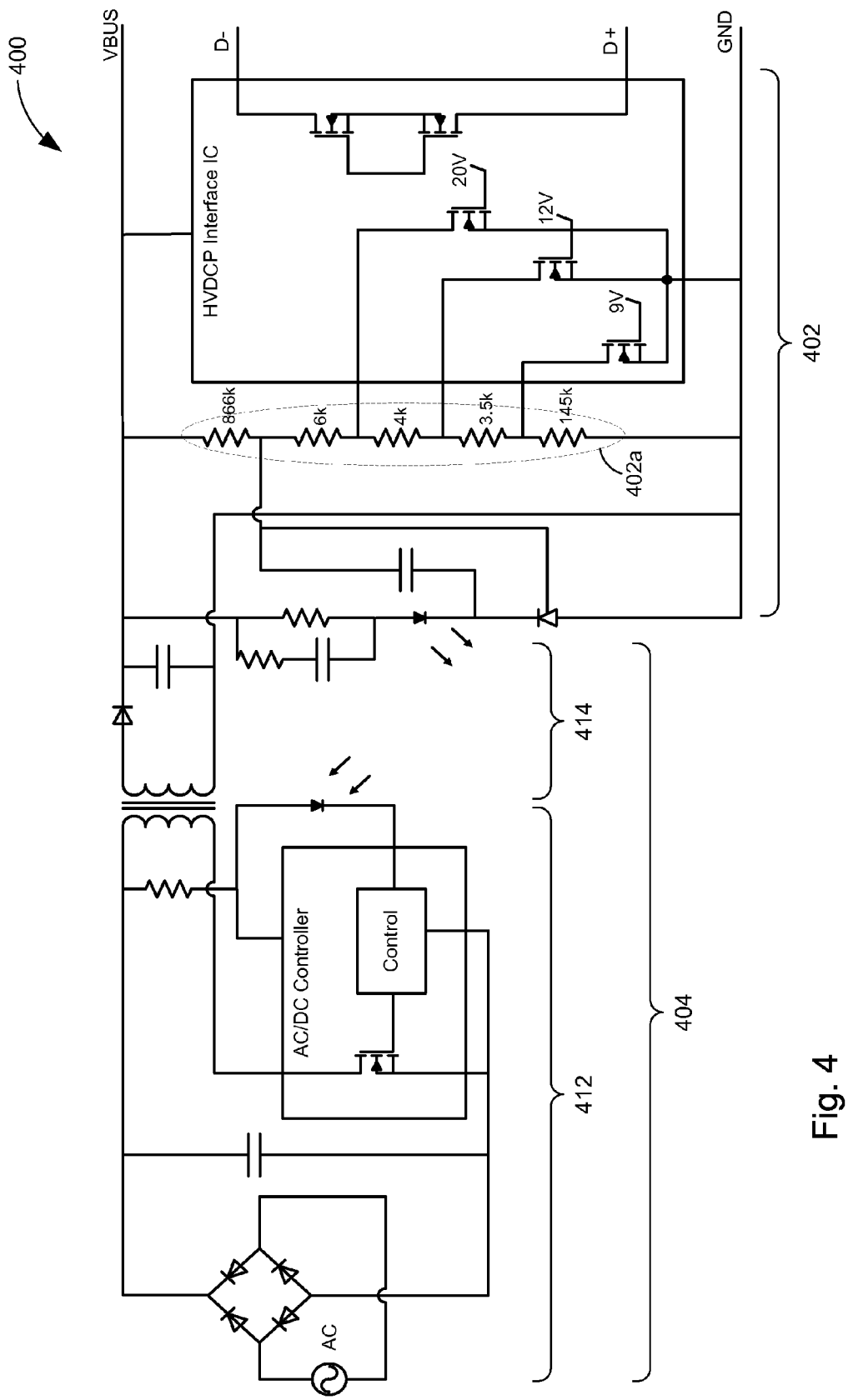
FIG. 4 illustrates an example of an external device.

An illustrative example of an external device 304 (FIG. 3) is the power supply 400 (e.g., wall adapter), shown in FIG. 4, that can provide 9V, 12V, and 20V voltage levels, in addition to the 5V that is conventionally provided on VBUS. A transformer may be used to electrically isolate the high-power primary side 404 from the low-power secondary side 402, which interfaces with the external environment. The secondary side 402 may include an interface IC having connections for the D+ and D− lines. The interface IC may include detection circuitry such as comparators 324a-324d shown in FIG. 3, for example. In some embodiments, the interface IC may be integrated into the AC/DC control IC. A primary side 404 may provide a selectable output voltage level on VBUS. For example, the primary side 404 may include a power section 412 that is coupled to the secondary side 402. In the particular example shown in FIG. 4, an optical coupling 414 comprising a transmitting LED on the side of the secondary side 402 may transmit optical signals to a receiving LED on the side of the power section 412 to control the output of the power section.

The interface IC may include circuitry and logic (not shown) that can detect and decode a particular electrical configuration asserted on the D+ and D− lines. The 9V, 12V, and 20V switches may be activated to control, via a resistor network 402a, the optical signal that is produced by the transmitting LED; e.g., by controlling the frequency of the optical signal. The optical signal may then be received by the receiving LED and sensed a controller in the power section 412. The controller may generate a voltage on VBUS having a voltage level based on the optical signal sensed by the receiving LED. It will be appreciated, of course, that the use of resistor network 402a and optical LEDs is simply illustrative and that in other embodiments, the secondary side 402 may communicate with the primary side 404 using any known signaling technique other than optical signaling; e.g., a digital signal may be sent from the secondary side to the primary side.

It will be appreciated that the external device 304 need not be a power supply per se, but may be any electronic device that is configured to provide multiple output voltage levels. For example, in some embodiments, the external device 304 may be a laptop computer that incorporates voltage selector 402 and includes a power source having selectable output voltage levels.

Figure 5:
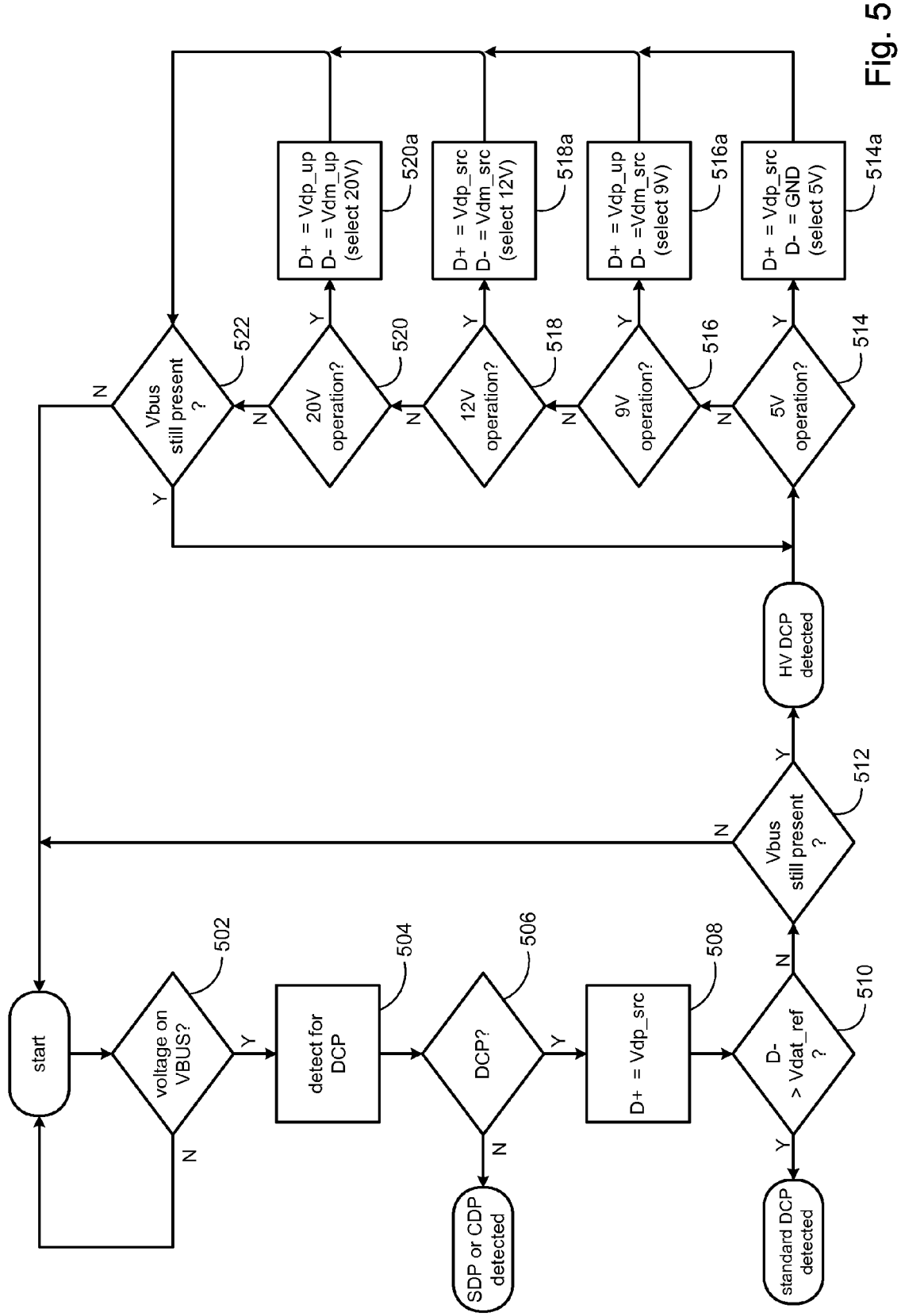
FIG. 5 shows a functional flow chart of the processing in the portable device shown in FIG. 3.

FIG. 5 illustrates processing in accordance with the present disclosure, when the portable device 302 (FIG. 3) attaches to an external device. As explained above, in some embodiments, the portable device 302 may operate in accordance with BC1.2 in which the portable device 302 is viewed as attaching to a port on the external device. Going forward, the terms "external device" and "port" may be used concurrently and/or interchangeably. Typical values for voltage levels mentioned below may be set in accordance with BC1.2. FIG. 7, for example, shows a table of voltage values set forth in BC1.2.

At loop 502, the portable device 302 may detect an attachment event. For example, an external device may output a voltage on VBUS. In accordance with BC1.2, if the portable device 302 detects a voltage level on VBUS>$V_{OTG\_SESSN\_VLD}$ for a predetermined period of time, the portable device 302 may determine that an attachment to the external device has occurred.

At block 504, the portable device 302 may determine whether the external device is a dedicated charging port (DCP) or not. At block 506, if a DCP is detected, processing continues at block 508; otherwise, a standard downstream port (SDP) or a charging downstream port (CDP) has been detected. The DCP, SDP, and CDP are port types defined in BC1.2.

In accordance with BC1.2, block 504 may include a primary detection step and a secondary detection step. The portable device 302 may perform primary detection to detect if the external device is an SDP by asserting an electrical configuration (i.e., a voltage level) on the D+ line and sensing an electrical configuration (i.e., a voltage level) asserted on the D− line. If an SDP is detected, then the NO branch of block 506 is taken and the portable device 302 may proceed in accordance with detection of a SDP. If the external device is determined not to be an SDP, then the portable device 302 may perform secondary detection to detect whether the external device is a DCP or a CDP by asserting an electrical configuration on the D− line and sensing an electrical configuration on the D+ line. If a CDP is detected, then the NO branch of block 506 is taken and the portable device 302 may proceed in accordance with detection of a CDP.

If a CDP is not detected, then in some embodiments, processing proceeds to block 508. In other embodiments, before proceeding to block 508, the portable device 302 may perform additional detection steps in block 504 to detect for attached devices that may be proprietary, may conform to other standards, or are otherwise non-compliant with BC1.2; e.g., Apple® power adapters typically do not conform to BC1.2, laptop manufacturers may produce power adapters that use proprietary circuitry, and so on. If a non-BC1.2 port is not detected, then processing may proceed to block 508.

Continuing with FIG. 5, if processing reaches block 508, the portable device 302 has determined that it is attached to a DCP. An external device in accordance with the present disclosure (e.g., 304, FIG. 3) appears electrically like a DCP at this point; i.e., the external device shorts together the D+ and D− lines using, for example, a switch connected between the D+ and D− lines as shown in FIG. 3. A conventional DCP is typically specified to output 5V. By comparison, an external device according to the present disclosure may output any one of several higher voltage levels (e.g., 9V, 12V, 20V, etc.), in addition to a 5V level. Accordingly, an external device in accordance with the present disclosure may be referred to as a high voltage DCP (HVDCP). In accordance with principles of the present disclosure, the portable device 302 may perform an additional detection to distinguish between an external device that is a conventional DCP and an HVDCP. Thus, in some embodiments, the portable device 302 may assert a voltage level $V_{DP\_SRC}$ on the D+ line, at block 508.

If the external device is a conventional DCP, the short between D+ and D− will be maintained. Accordingly, at block 510, the portable device 302 will sense that the voltage level asserted at D− is >$V_{DAT\_REF}$ and detect that a conventional DCP is attached.

If the external device is an HVDCP (e.g., 304, FIG. 3), then, in accordance with the present disclosure, the HVDCP will respond to the D+ line being asserted at $V_{DP\_SRC}$ by opening the short between the D+ and D− line. Accordingly, at block 510, the portable device 302 will sense a voltage level asserted at D− that is ≤$V_{DAT\_REF}$, which may indicate that an HVDCP is attached. At block 512, if the portable device 302 continues to detect a voltage on VBUS, that may serve to indicate to the portable device that the external device is still attached and that the external device is an HVDCP.

At this point, the portable device 302 may select an operating voltage to receive from the HVDCP. If 5V operation is desired at block 514, the portable device 302 may assert the following electrical configuration on the D+ and D− lines at block 514a: $V_{DP\_SRC}$ on D+ and ground potential on D−. Similarly, if 9V operation is desired at block 516, the portable device may assert the following electrical configuration on the D+ and D− lines at block 516a: $V_{DP\_UP}$ on D+ and $V_{DM\_SRC}$ on D−. If 12V operation is desired at block 518, the portable device may assert the following electrical configuration on the D+ and D− lines at block 518a: $V_{DP\_SRC}$ on D+ and $V_{DM\_SRC}$ on D−. If 20V operation is desired at block 516, the portable device may assert the following electrical configuration on the D+ and D− lines at block 516a: $V_{DP\_UP}$ on D+ and $V_{DM\_UP}$ on D−.

It can be appreciated, of course, that any suitable combination of voltage levels may be associated with the different operating voltages. It can further appreciated that in some embodiments, different current flows can be asserted on the D+ and D− lines instead of asserting voltage levels. More generally, combinations of different voltage levels and current flows may be asserted on the D+ and D− lines.

Continuing with FIG. 5, in some embodiments, if at block 522 a voltage level is still present on VBUS, processing may loop back to block 514. The loop allows the portable device 302 to dynamically change the operating voltage as needed, providing a high degree of flexibility of operation in the portable device 302. Thus, for example, at a time $t_1$, the portable device 302 may assert a first electrical configuration on the D+ and D− lines to receive a first voltage level on VBUS. At a subsequent time $t_2$ (without having to re-attach) the HVDCP, the portable device 302 may assert a second electrical configuration on the D+ and D− lines to receive a second voltage level on VBUS.

Figure 6:
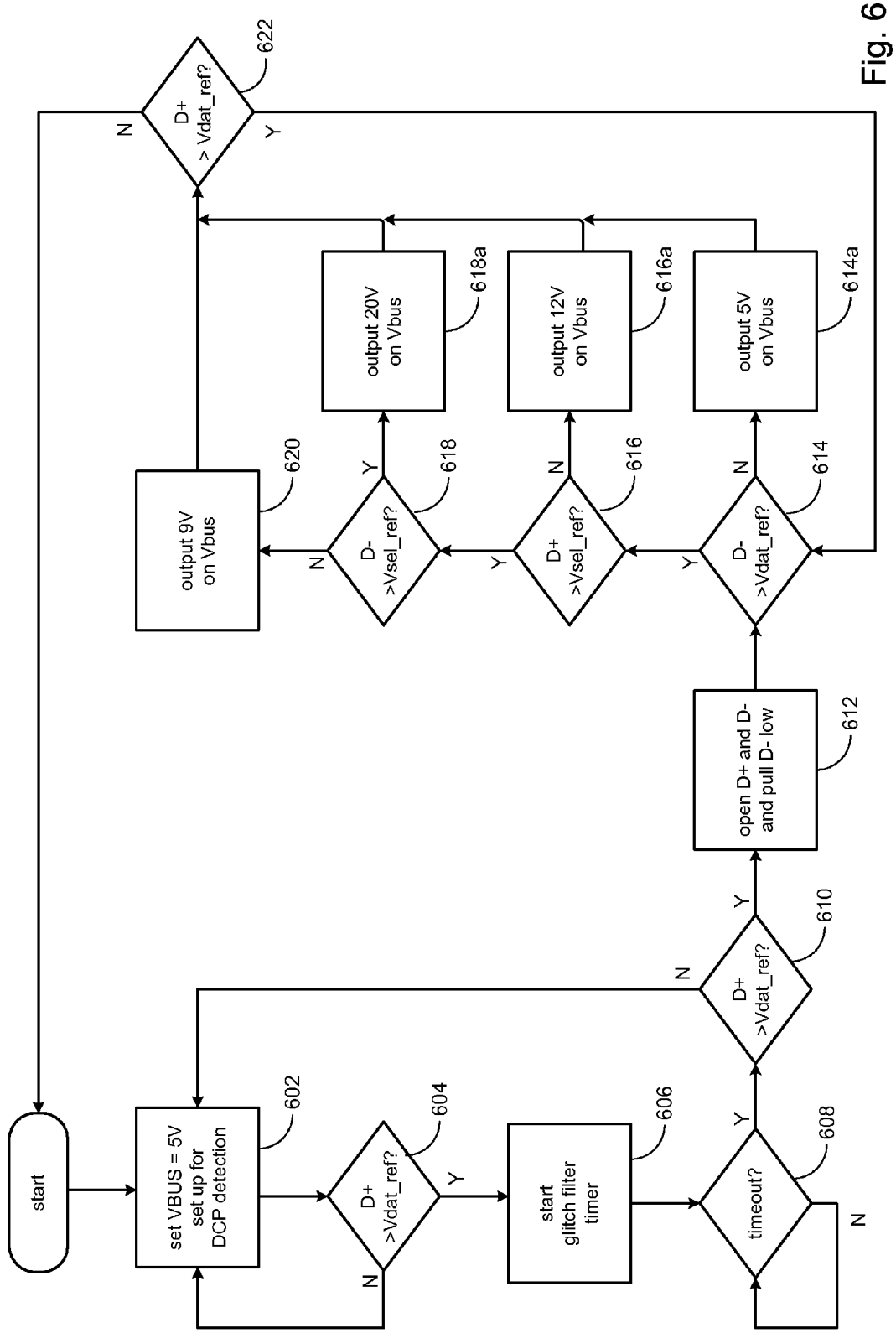
FIG. 6 shows a function flow chart of the processing in the external device shown in FIG. 3.

Referring now to FIG. 6, processing in an external device (e.g., 304, FIG. 3) in accordance with the present disclosure, namely an HVDCP, will now be discussed. At block 602, the HVDCP may initialize itself for detection as a DCP. For example, the HVDCP may assert 5V on VBUS and short the D+ and D− lines. In addition, the D+line is pulled down using resistor $R_{DAT\_LKG}$ (about 500 KΩ) per BC1.2. In this state, the HVDCP appears electrically to be a DCP. The HVDCP enters a loop 604 until the D+ line exceeds $V_{DAT\_REF}$.

When the HVDCP is attached to the portable device 302, the portable device will proceed through its detection sequence as described above. If the portable device 302 can accept different output voltage levels on VBUS, the portable device can indicate this fact to the HVDCP by asserting $V_{DP\_SRC}$ on the D+ line (block 508, FIG. 5), which the HVDCP will detect at blocks 606 and 608.

At blocks 606 and 608, a timer (not shown) in the HVDCP may be initiated while the HVDCP is sensing the D+ line using the glitch filter 334 (FIG. 3). The glitch filter 334 may provide a measure of safety by avoiding a false positive indication that the portable device 302 accept different voltage levels. At block 610, if the D+ line remains $>V_{DAT\_REF}$ after the timeout, this may indicate to the HVDCP that the portable device 302 can receive different operating voltage levels and is looking for an HVDCP. Accordingly, at block 612, the HVDCP may open the short between the D+ and D− lines and pull down the D− line through resistor $R_{DM\_DWN}$ to indicate to the portable device 302 that it is attached to an HVDCP.

At block 614, if the HVDCP senses an electrical configuration where the D− line is $>V_{DAT\_REF}$, then at block 614a the HVDCP will output 5V on VBUS. At block 616, if the HVDCP senses an electrical configuration where the D+ line is $>V_{DAT\_REF}$, then at block 616a the HVDCP will output 12V on VBUS. Similarly, at block 618, if the HVDCP senses an electrical configuration where the D− line is $>V_{SEL\_REF}$, then at block 618a the HVDCP will output 20V on VBUS. Otherwise, at block 620 the HVDCP will output 9V on VBUS. In some embodiments, $V_{SEL\_REF}$ may be set to 2V±0.2V.

Processing continues to block 622 to check that the D+ line continues to be $>V_{DAT\_REF}$. If so, processing loops back to block 614, allowing the HVDCP to change its output voltage to a different level.

Figure 8:
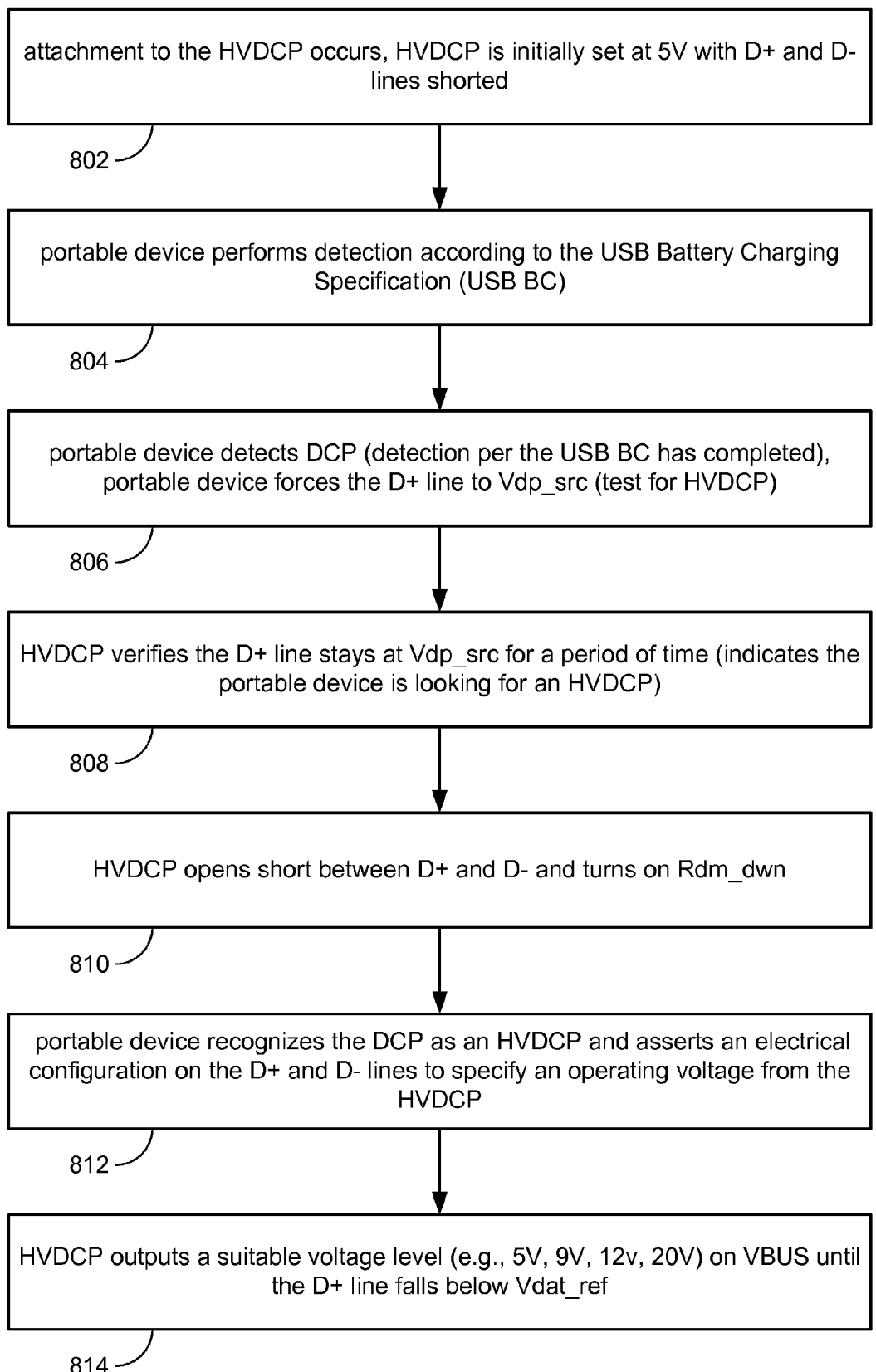
FIG. 8 is a summary of system operation according to the present disclosure.

The foregoing processing between the portable device 302 and the HVDCP may be summarized in the flow chart shown in FIG. 8. At 802, an HVDCP is attached to the portable device. The HVDCP is initially configured to appear as a DCP by outputting 5V on VBUS and shorting its D+ and D− lines. At 804, the portable device performs detection according to BC1.2. At 806, the portable device detects a DCP, thus marking completion of the detection process per BC1.2. The portable device then asserts $V_{DP\_SRC}$ on the D+ line, in accordance with principles of the present disclosure, to see if the attached DCP is an HVDCP. At 808, the HVDCP senses the D+ line to look for $V_{DP\_SRC}$, which indicates the portable device is capable of receiving multiple voltage levels. At 810, the HVDCP opens the short between D+ and D− and turns on $R_{DM\_DWN}$ to signify to the portable device that an HVDCP is attached. At 812, the portable device asserts an electrical configuration on D+ and D− corresponding to a desired voltage level. At 814, the HVDCP outputs the desired voltage level.

An advantageous aspect of the present disclosure is that backward compatibility with existing devices is maintained. For example, a portable device in accordance with the principles of the present disclosure will recognize and operate with an HVDCP, according to the processing outlined in FIGS. 5 and 6 above. Moreover, a portable device in accordance with the principles of the present disclosure will recognize and operate with non-HVDCP devices, such as an SDP, CDP, DCP, and in some embodiments, non-BC1.2 ports (e.g., Apple® power adapters) per blocks 502, 504, and 506 in FIG. 5. From the HVDCP side, an HVDCP will operate with a portable device of the present disclosure in accordance with the processing outlined in FIGS. 5 and 6 above. Moreover, an HVDCP will operate with a conventional portable device by virtue of the loop 602-604 in FIG. 6. Since a conventional portable device will not assert $V_{DP\_SRC}$ on the D+ signal line after DCP detection, processing in the HVDCP will take the NO branch from block 604.

The above description illustrates various embodiments of the present invention along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. An electronic circuit comprising:
    a power bus;
    a signal bus; and
    circuitry connected to the signal bus,
    the circuitry being operative to:
        detect an electrical configuration from among a plurality of electrical configurations on the signal bus, each of the electrical configurations being associated with a voltage level; and
        provide power to the power bus at a voltage level that is substantially equal to the voltage level associated with the electrical configuration detected on the signal bus by the circuitry.

2. The electronic circuit of claim 1 wherein the electrical configuration detected by the circuitry is asserted on the signal bus by a device connected to the signal bus.

3. The electronic circuit of claim 2 wherein the device is connected to the power bus.

4. The electronic circuit of claim 1 wherein the circuitry is further operative to assert a predetermined electrical configuration on the signal bus, wherein the electrical configuration detected by the circuitry is asserted in response to the predetermined electrical configuration having been asserted on the signal bus.

5. The electronic circuit of claim 4 wherein the predetermined electrical configuration indicates that the electronic circuit is capable of providing a selectable voltage level on the power bus.

6. The electronic circuit of claim 1 wherein the circuitry is connectable to a power circuit.

7. The electronic circuit of claim 1 wherein the circuitry is further operative to assert an initial electrical configuration on the signal bus that indicates the electronic circuit operates as a dedicated charging port (DCP).

8. The electronic circuit of claim 1 wherein the signal bus comprises a plurality of signal lines.

9. The electronic circuit of claim 8 further comprising:
    a VBUS pin connected to the power bus;
    a D+ pin connected to the signal bus; and
    a D− pin connected to the signal bus.

10. The electronic circuit of claim 1 wherein the plurality of electrical configurations includes at least a first electrical configuration that is associated with a first voltage level and a second electrical configuration that is associated with a second voltage level, wherein power provided to the power bus is at the first voltage level in response to the circuitry detecting the first electrical configuration on the signal lines and power provided to the power bus is at the second voltage level in response to the circuitry detecting the second electrical configuration on the signal lines.

11. The electronic circuit of claim 1 wherein the electrical configuration detected by the circuitry is asserted on the signal bus by a device connected to the electronic circuit, wherein the electronic circuit provides power to the device.

12. A circuit comprising:
a power bus;
a signal bus; and
first circuitry connected to the signal bus to detect an electrical configuration from among a plurality of electrical configurations on the signal bus, each of the electrical configurations being associated with a voltage level,
second circuitry connected to the power bus, the second circuitry operative with the first circuitry to provide power to the power bus at a voltage level that is substantially equal to the voltage level associated with the electrical configuration detected on the signal bus by the first circuitry.

13. The circuit of claim 12 wherein the second circuitry is connectable to a power section.

14. The circuit of claim 12 wherein the first circuitry is operative to assert a predetermined electrical configuration on the signal bus, wherein the electrical configuration detected by the first circuitry is asserted in response to the predetermined electrical configuration having been asserted on the signal bus.

15. The circuit of claim 12 wherein the first circuitry is operative to assert an initial electrical configuration on the signal bus that indicates the electronic circuit operates as a dedicated charging port (DCP).

16. The circuit of claim 12 further comprising:
a VBUS pin connected to the power bus;
a D+ pin connected to the signal bus; and
a D− pin connected to the signal bus.

17. The circuit of claim 12 wherein the plurality of electrical configurations includes at least a first electrical configuration that is associated with a first voltage level and a second electrical configuration that is associated with a second voltage level, wherein the second circuitry provides power to the power bus at the first voltage level in response to the first circuitry detecting the first electrical configuration on the signal lines and the second circuitry provides power to the power bus at the second voltage level in response to the first circuitry detecting the second electrical configuration on the signal lines.

18. A circuit comprising:
a power bus;
a signal bus;
first means for detecting an electrical configuration from among a plurality of electrical configurations on the signal bus asserted by a device connected to the circuit, each of the electrical configurations being associated with a voltage level; and
second means, operative with the first means, for providing power on the power bus at a voltage level that is substantially equal to the voltage level associated with the electrical configuration detected on the signal bus by the first means.

19. The circuit of claim 18 wherein the first means further is for asserting a predetermined electrical configuration on the signal bus, wherein the electrical configuration detected by the first means is asserted in response to the predetermined electrical configuration having been asserted on the signal bus.

20. The circuit of claim 18 wherein the signal bus comprises a plurality of signal lines.

21. The circuit of claim 18 wherein the circuit provides power to the device connected to the circuit.

22. An electronic circuit comprising:
a power bus;
a signal bus; and
circuitry connected to the signal bus,
the circuitry being operative to:
detect a first electrical configuration on the signal bus from a device that can be connected to the signal bus;
in response to detecting the first electrical configuration, assert a second electrical configuration on the signal bus;
subsequent to asserting the second electrical configuration, detect a third electrical configuration from among a plurality of third electrical configurations on the signal bus, each of the third electrical configurations being associated with a voltage level; and
provide power to the power bus at a voltage level that is substantially equal to the voltage level associated with the third electrical configuration detected on the signal bus by the circuitry.

* * * * *